(12) United States Patent
Lee

(10) Patent No.: US 10,848,154 B2
(45) Date of Patent: Nov. 24, 2020

(54) LEVEL SHIFTER AND DRIVER CIRCUIT INCLUDING THE LEVEL SHIFTER

(71) Applicant: SK hynix Inc., Icheon-si (KR)

(72) Inventor: Seung Ho Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/656,217

(22) Filed: Oct. 17, 2019

(65) Prior Publication Data

US 2020/0195250 A1 Jun. 18, 2020

(30) Foreign Application Priority Data

Dec. 17, 2018 (KR) .......................... 10-2018-0162871

(51) Int. Cl.
| | | |
|---|---|---|
| *H03K 19/0175* | (2006.01) | |
| *H03K 19/017* | (2006.01) | |
| *G05F 3/26* | (2006.01) | |
| *G11C 5/14* | (2006.01) | |
| *H03K 19/0185* | (2006.01) | |

(52) U.S. Cl.
CPC ....... *H03K 19/01721* (2013.01); *G05F 3/262* (2013.01); *G11C 5/147* (2013.01); *H03K 19/018507* (2013.01)

(58) Field of Classification Search
CPC ....... H03K 19/00315; H03K 19/01721; H03K 19/018507; H03K 19/018521; H03K 19/018528; H03K 19/018535; H03K 3/356113; G06F 3/262; G11C 5/147
See application file for complete search history.

(56) References Cited

U.S. PATENT DOCUMENTS

| | | | |
|---|---|---|---|
| 5,852,540 A | 12/1998 | Haider | |
| 6,204,701 B1 | 3/2001 | Tsay et al. | |
| 6,342,803 B1 | 1/2002 | McManus | |
| 6,693,469 B2 | 2/2004 | Prodanov | |

(Continued)

FOREIGN PATENT DOCUMENTS

KR     1020080038954 A     5/2008

OTHER PUBLICATIONS

Karthik Rajagopal et al., "An Enhanced Topology for Reliability of a High Performance 3.3V I/O Buffer in a Single-well Bulk CMOS 1.8v-oxide Low voltage Process", 10th Int'l Symposium on Quality Electronic Design, 2009, pp. 103-106, IEEE, Bagmane Tech Park Bangalore, Karnataka—560093 India.

(Continued)

*Primary Examiner* — Long Nguyen
(74) *Attorney, Agent, or Firm* — William Park & Associates Ltd.

(57) ABSTRACT

A level shifter includes a current mirror configured to receive an input signal in response to a first power voltage and generate an output signal by mirroring a current corresponding to a second power voltage based on a level of the input signal, a first adjusting circuit coupled to an output terminal of the current mirror and configured to adjust a voltage level of the output terminal of the current mirror in response to a bias voltage, and a second adjusting circuit coupled to a power voltage terminal which receives the second power voltage in parallel to the current mirror and configured to adjust the voltage level of the output terminal of the current mirror.

12 Claims, 2 Drawing Sheets

(56) References Cited

U.S. PATENT DOCUMENTS

| | | | |
|---|---|---|---|
| 7,161,396 | B1 | 1/2007 | Zhou et al. |
| 7,504,862 | B2 * | 3/2009 | De Sandre ....... H03K 19/01707 326/80 |
| 7,719,806 | B1 | 5/2010 | Boyd et al. |
| 8,212,590 | B2 | 7/2012 | Wang et al. |
| 8,610,488 | B2 | 12/2013 | Yu et al. |
| 8,803,580 | B2 | 8/2014 | Shi et al. |
| 8,817,434 | B2 | 8/2014 | Wang et al. |
| 8,994,412 | B2 | 3/2015 | Kim |
| 9,419,615 | B2 | 8/2016 | Hsu et al. |
| 10,088,882 | B2 | 10/2018 | Aoki |
| 10,193,545 | B1 | 1/2019 | Pankratz et al. |
| 10,382,040 | B2 * | 8/2019 | Kwon .............. H03K 3/356113 |
| 2006/0226873 | A1 | 10/2006 | Sandre et al. |
| 2008/0054982 | A1 | 3/2008 | Rhee |
| 2010/0141324 | A1 | 6/2010 | Wang et al. |
| 2010/0176848 | A1 | 7/2010 | Du et al. |
| 2010/0271118 | A1 | 10/2010 | Bhattacharya et al. |
| 2018/0342280 | A1 | 11/2018 | Lee |

OTHER PUBLICATIONS

Karthik Rajagopal et al., "Dynamically Biased Low Power High Performance 3.3V Output Buffer in a Single Well Bulk CMOS 1.8V Oxide 45nm Process", 13th Int'l Symposium on Quality Electronic Design, 2012, pp. 159-164, IEEE, Bagmane Tech Park Bangalore, Karnataka—560093 India.

Marcs Ng, "3.3V Transmitter Using 1.8V Transistors in a Cascode Configuration", Jan. 1, 2013, pp. 1-41, Paper 2056, Ryerson University.

Vinod Kumar, et al., "Power Sequence free 400Mbps 90µW 6000µm2 1.8V-3.3V Stress Tolerant I/O Buffer in 28nm CMOS", 2013, pp. 37-40, IEEE, Greater Noida, Uttar Pradesh, India.

Chen, S. et al., An Output Buffer for 33-V Applications in a 0.13-1-µm 1/2.5-V CMOS Process, Jan. 2007, pp. 14-18, vol. 54, No. 1, IEEE.

Guo, H. et al., A Novel Mixed-Voltage I/O Buffer With Low-Voltage Thin-Oxide CMOS Transistors, 2014, IEEE.

Ismail, Y. et al., A Compact Stacked-Device Output Driver in Low-Voltage CMOS Technology, 2014, pp. 1624-1627, IEEE.

Liu, G. et al., A New Design of Mixed-Voltage I/O Buffers with Low-Voltage-Thin-Oxide CMOS Process, 2007, pp. 201-204, IEEE.

* cited by examiner

LEVEL SHIFTER AND DRIVER CIRCUIT INCLUDING THE LEVEL SHIFTER

CROSS-REFERENCES TO RELATED APPLICATION

The present application claims priority under 35 U.S.C. § 119(a) to Korean application number 10-2018-0162871, filed on Dec. 17, 2018, in the Korean Intellectual Property Office, which is incorporated herein by reference in its entirety.

BACKGROUND

1. Technical Field

Various embodiments may generally relate to a semiconductor circuit, and more particularly, to a level shifter and a driver circuit including the level shifter.

2. Related Art

There are differences in operation voltages between semiconductor memory devices and host devices (for example, memory controllers) which control the semiconductor memory devices.

Accordingly, there is a need for level shifters for compensating the operation voltage difference between the semiconductor memory devices and the host devices.

Transistors which are unit elements constituting the level shifter in the related art are fabricated with thick gate oxides or medium gate oxides and thus there are limitations in the level shifters in the circuit dimension aspects.

With the increase in the operation speed of the semiconductor memory devices, a low voltage is need to be used as compared with the related art in the aspects of power consumption, noise, and input/output pad capacitance and thus there is a need for studying a level shifter which can reliably operate within the low operation voltages.

SUMMARY

In an embodiment of the present disclosure, a level shifter may include: a current mirror configured to receive an input signal in response to a first power voltage and generate an output signal by mirroring a current corresponding to a second power voltage based on a level of the input signal; a first adjusting circuit coupled to an output terminal of the current mirror and configured to adjust a voltage level of the output terminal of the current mirror in response to a bias voltage; and a second adjusting circuit coupled to a power voltage terminal which receives the second power voltage in parallel to the current mirror and configured to adjust the voltage level of the output terminal of the current mirror.

In another embodiment of the present disclosure, a level shifter may include: a first switching element configured to receive an input signal in response to a first power voltage; a second switching element configured to receive an inverted input signal in response to the first power voltage; a third switching element coupled between a power voltage terminal configured to receive a second power voltage and an output terminal; a fourth switching element coupled between the power voltage terminal and the output terminal in parallel to the third switching element; a fifth switching element which is coupled between the output terminal and the first switching element and a first bias voltage is applied to a control terminal thereof; and a sixth switching element which is coupled between the power voltage terminal and the output terminal in parallel to the third switching element and an internally generated compensation voltage is input to a control terminal thereof.

DETAILED DESCRIPTION

Various embodiments will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

Embodiments should not be construed as limiting. Although a few embodiments will be shown and described, it will be appreciated by those of ordinary skill in the art that changes may be made in these embodiments.

Embodiments are provided for a level shifter that may be capable of operating in high speed and improving the reliability in a high-speed operation and a driver circuit including the same.

Figure 1:
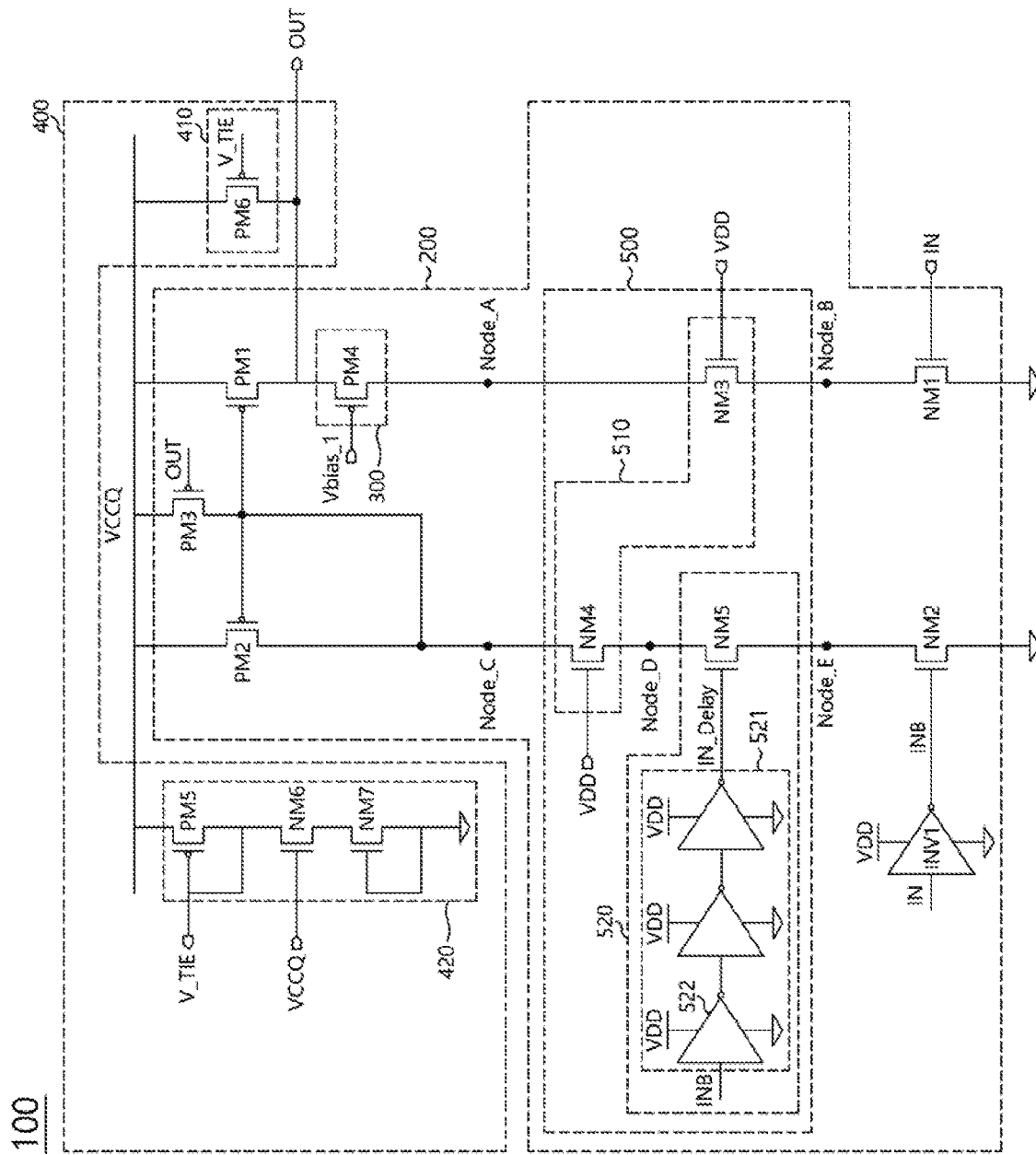
FIG. 1 is a diagram illustrating a configuration of a level shifter according to an embodiment of the present disclosure.

FIG. 1 is a diagram illustrating a configuration of a level shifter according to an embodiment of the present disclosure.

As illustrated in FIG. 1, a level shifter 100 according to an embodiment includes a current mirror 200, a first adjusting circuit 300, and a second adjusting circuit 400.

The level shifter 100 according to an embodiment may further include a third adjusting circuit 500.

All unit elements constituting the level shifter 100 according to an embodiment, for example, transistors may use a low operation voltage as compared with transistors in the related art and thus the transistors may be designed with a thin gate oxide element. Accordingly, the circuit dimension of the transistor may be reduced.

The current mirror 200 may receive an input signal IN in response to a first power voltage VDD and output an output signal OUT by mirroring a current corresponding to a second power voltage VCCQ based on a level of the input signal IN.

The second power voltage VCCQ may have a higher voltage level than the first power voltage VDD.

The current mirror 200 may include an inverter INV1 and a plurality of switching elements NM1, NM2, PM1, PM2, and PM3.

A first current path of the current mirror 200 may be formed by a plurality of switching elements PM1, PM4, NM3, and NM1.

A second current path of the current mirror 200 may be formed by a plurality of switching elements PM2, NM4, NM5, and NM2.

The first adjusting circuit 300 may be coupled to an output voltage OUT terminal of the current mirror 200 and configured to adjust a voltage level of the output voltage OUT terminal based on a first bias voltage Vbias_1.

The first adjusting circuit 300 may include a switching element PM4.

The second adjusting circuit 400 may be coupled to a second power voltage VCCQ terminal in parallel to the current mirror 200 and configured to adjust the voltage level of the output voltage OUT terminal of the current mirror 200.

The second adjusting circuit 400 may include an output voltage compensation unit 410 and a compensation voltage generation unit 420.

The output voltage compensation unit 410 may prevent the voltage level of the output voltage OUT terminal from being lowered less than a voltage level increased through the first adjusting circuit 300 in response to a compensation voltage V_TIE.

The compensation voltage generation unit 420 may be coupled to the second power voltage VCCQ terminal in parallel to the current mirror 200 and may generate the compensation voltage V_TIE.

The second adjusting circuit 400 may include a plurality of switching elements PM5, PM6, NM6, and NM7.

The third adjusting circuit 500 may be coupled to the first current path and the second current path of the current mirror 200 and configured to adjust voltage levels of the first current path and the second current path and to block a leakage current in the second current path.

The third adjusting circuit 500 may include a first adjusting unit 510 and a second adjusting unit 520.

The first adjusting unit 510 may adjust the voltage levels of the first current path and the second current path of the current mirror 200 in response to the first power voltage VDD.

The second adjusting unit 520 may block the leakage current of the second current path of the current mirror 200 in response to the inverted input signal INB.

The third adjusting circuit 500 may include a delay circuit 521 and a plurality of switching elements NM3, NM4, and NM5.

For example, when it is assumed that the first power voltage VDD is 0.8 V and the second power voltage VCCQ is 1.2 V, node voltage differences Vds, Vgs, and Vg have to be maintained, for example, to 1.06 V or below even in any operation condition to guarantee the reliability of all elements constituting the level shifter 100.

Accordingly, the level shifter 100 according to an embodiment may be designed to satisfy the above-described node voltage difference condition by constituting the first adjusting circuit 300 and the second adjusting circuit 400 and may improve stability and leakage current preventing capacity by additionally constituting the third adjusting circuit 500.

One terminal of a first switching element NM1 may be coupled to a ground terminal, the other terminal thereof may be coupled to a node Node_B, and a control terminal thereof may receive the input signal IN.

One terminals of the plurality of switching elements NM1, NM2, PM1, PM2, and PM3 may be sources or drains, the other terminals thereof may be drains or sources, and control terminals thereof may be gates.

The inverter INV1 may generate an inverted input signal INB by inverting the input signal IN.

One terminal of a second switching element NM2 may be coupled to the ground terminal, the other terminal thereof may be coupled to a node Node_E, and a control terminal thereof may receive the inverted input signal INB.

One terminal of a third switching element PM1 may be coupled to the second power voltage VCCQ terminal and the other terminal thereof may be coupled to the output voltage OUT terminal.

One terminal of a fourth switching element PM2 may be coupled to the second power voltage VCCQ terminal and the other terminal thereof may be coupled to a node Node_C.

One terminal of a fifth switching element PM3 may be coupled to the second power voltage VCCQ terminal, the other terminal thereof may be commonly coupled to the control terminals of the third and fourth switching elements PM1 and PM2, and a control terminal thereof may receive the output voltage OUT.

One terminal of a sixth switching element PM4 may be coupled to the output voltage OUT terminal, the other terminal thereof may be coupled to a node Node_A, and a control terminal thereof may receive the first bias voltage Vbias_1.

The first bias voltage Vbias_1 may be, for example, 0.12V. In other embodiments, the first bias voltage Vbias_1 may be different from 0.12V.

Since the sixth switching element PM4 may receive the first bias voltage Vbias_1 through the control terminal (for example, the gate), the output voltage OUT may be set to have a variation range corresponding to a voltage range (for example, Vbias_1+Vth_PM4 to VCCQ) in an AC operation and may be set to be fixed to a voltage level (for example, Vbias_1+Vth_PM4 or VCCQ) in a DC operation. Accordingly, the above-described node voltage difference condition may be satisfied.

One terminal of a seventh switching element PM6 may be coupled to the second power voltage VCCQ terminal, the other terminal thereof may be coupled to the output voltage OUT terminal, and a control terminal thereof may receive the compensation voltage V_TIE.

Eighth to tenth switching elements PM5, NM6, and NM7 may be coupled between the second power voltage VCCQ terminal and the ground voltage in series and may generate the compensation voltage V_TIE in response to the second power voltage VCCQ.

The current mirroring of the seventh switching element PM6 may be accomplished in response to the compensation voltage V_TIE generated through the eighth to tenth switching elements PM5, NM6, and NM7 and the current according to the current mirroring may be supplied to the output voltage OUT terminal.

Since the current is continuously supplied to the output voltage OUT terminal through the seventh switching element PM6, the output voltage OUT may be prevented from being lowered less than the voltage level of Vbias_1+Vth_PM4 even when the input signal IN of a high level is input to the control terminal of the first switching element NM1.

The seventh switching element PM6 may prevent the voltage level of the output voltage OUT from being lowered less than the voltage level of Vbias_1+Vth_PM4, and thus the operation reliability of the third switching element PM1 may be guaranteed.

One terminal of an eleventh switching element NM3 which is arranged in the first current path may be coupled to the node Node_A, the other terminal thereof may be coupled to the node Node_B, and a control terminal thereof may receive the first power voltage VDD.

Since the first power voltage VDD is applied to the control terminal of the eleventh switching element NM3, the eleventh switching element NM3 may drop the voltage of the node Node_B by the voltage level of VDD−Vth_NM3 (i.e., the voltage level of the first power voltage VDD minus the threshold voltage of the switching element NM3) and thus the operation reliability of the first switching element NM1 may be improved.

One terminal of a twelfth switching element NM4 which is arranged in the second current path may be coupled to the node Node_C, the other terminal thereof may be coupled to the node Node_D, and a control terminal thereof may receive the first power voltage VDD.

The twelfth switching element NM4 may also be operated in the same manner as the eleventh switching element NM3 and the operation reliability of a thirteenth switching element NM5 to be described later may be improved.

The delay circuit 521 may be configured of an inverter array 521 including a plurality of inverters 522.

The inverter array 521 may generate a delayed input signal IN_Delay by delaying and inverting the inverted input signal INB.

One terminal of the thirteenth switching element NM5 may be coupled to the node Node_D, the other terminal thereof may be coupled to the node Node_E, and a control terminal thereof may receive the delayed input signal IN_Delay.

The thirteenth switching element NM5 may operate with a time delay with respect to the second switching element NM2 in response to the delayed input signal IN_Delay and mitigate the current path from being formed beyond a certain time or more required for the level transition of the output voltage OUT terminal and thus the leakage current may be minimized.

Figure 2:
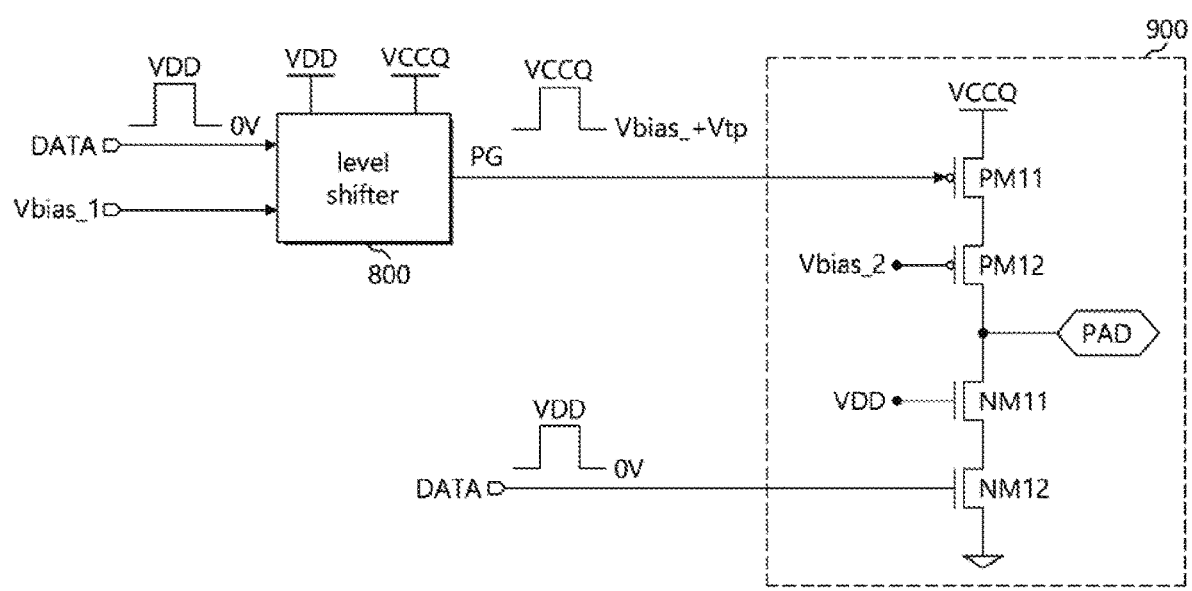
FIG. 2 is a diagram illustrating a configuration of a driver circuit according to an embodiment of the present disclosure.

FIG. 2 is a diagram illustrating a configuration of a driver circuit according to an embodiment of the present disclosure.

As illustrated in FIG. 2, a driver circuit 700 according to an embodiment may include a level shifter 800 and a pull-up/pull-down circuit 900.

The level shifter 800 may have the same configuration as that of the level shifter 100 of FIG. 1.

The level shifter 800 may receive data DATA provided from an external apparatus such as a memory controller, a host device, and the like using the first bias voltage Vbias_1, adjust a level variation range of the data DATA to a level suitable for an apparatus (for example, a semiconductor memory) which uses the data, and generate the level-adjusted data as an output signal PG.

The data DATA may have a voltage variation range (0 V−VDD) of from a ground voltage level to a first power voltage VDD level.

The output signal PG of the level shifter 800 may have a variation range corresponding to a voltage range of Vbias_1+Vtp−VCCQ.

The pull-up/pull-down circuit 900 may include a plurality of switching elements PM11, PM12, NM11, and NM12 coupled between the second power voltage VCCQ terminal and the ground voltage terminal in series.

The first switching element PM11 may receive the output signal PG of the level shifter 800 through a control terminal thereof.

The second switching element PM12 may receive a second bias voltage Vbias_2 through a control terminal thereof.

The first switching element PM11 and the second switching element PM12 may pull up a level of an output terminal PAD to a second power voltage VCCQ level.

The output terminal PAD may be an input/output (I/O) pad of the semiconductor memory.

The third switching element NM11 may receive the first power voltage VDD through a control terminal thereof.

The fourth switching element NM12 may receive the data DATA through a control terminal thereof.

The third switching element NM11 and the fourth switching element NM12 may pull down the level of the output terminal PAD to the ground voltage level.

As described above with reference to FIG. 1, the level shifter 800 may satisfy the node voltage difference conditions of all the elements constituting the level shifter 800 and thus the output voltage PG of the level shifter 800 may also have a variation range corresponding the voltage range of Vbias_1+Vtp~VCCQ. Accordingly, the high-speed operation of the first switching element PM11 which substantially conducts a driving operation of the driver circuit 700 may be accomplished and operation reliability of the first switching element PM11 may also be improved.

The above described embodiments are intended to illustrate and not to limit the present teachings. Various alternatives and equivalents are possible. The teachings are not limited by the embodiments described herein. Nor are the embodiments limited to any specific type of semiconductor apparatus. Other additions, subtractions, or modifications are obvious in view of the present disclosure and are intended to fall within the scope of the appended claims.

What is claimed is:

1. A level shifter comprising:
  a current mirror configured to receive an input signal in response to a first power voltage and generate an output signal by mirroring a current corresponding to a second power voltage based on a level of the input signal;
  a first adjusting circuit coupled to an output terminal of the current mirror and configured to adjust a voltage level of the output terminal of the current mirror in response to a bias voltage;
  a second adjusting circuit coupled to a power voltage terminal which receives the second power voltage in parallel to the current mirror and configured to adjust the voltage level of the output terminal of the current mirror, and
  a third adjusting circuit coupled to a first current path and a second current path of the current mirror and configured to adjust voltage levels of the first current path and the second current path and to block a leakage current of the second current path,
  wherein the third adjusting circuit includes:
  a first adjusting unit configured to adjust the voltage levels of the first and second current paths in response to the first power voltage; and
  a second adjusting unit configured to block the leakage current of the second current path in response to the input signal.

2. The level shifter of claim 1, wherein the current mirror includes:
  a first switching element of which one terminal is coupled to the power voltage terminal;
  a second switching element of which one terminal is coupled to the power voltage terminal and the other terminal is coupled to the output terminal;
  a third switching terminal of which one terminal is coupled to the power voltage terminal, the other terminal is commonly coupled to a control terminal of the first switching element and a control terminal of the second switching element, and a control terminal is coupled to the output terminal of the current mirror;

a fourth switching element of which the input signal is input to a control terminal; and a fifth switching element of which an inverted input signal is input to a control terminal.

3. The level shifter of claim 1, wherein the first adjusting circuit is configured to maintain a voltage level of an output voltage of the output terminal of the current mirror to be equal to or greater than a value, the value equal to a sum of the bias voltage and a threshold voltage of the first adjusting circuit.

4. The level shifter of claim 1, wherein the second adjusting circuit is configured to prevent a voltage level of the output terminal from being lowered less than a voltage level increased through the first adjusting circuit.

5. The level shifter of claim 1, wherein the second adjusting circuit includes:

a compensation voltage generation unit coupled to the power voltage terminal in parallel to the current mirror and configured to generate a compensation voltage; and an output voltage compensation unit of which one terminal is coupled to the power voltage terminal, the other terminal is coupled to the output terminal, a control terminal receives the compensation voltage and which is configured to prevent a voltage level of the output terminal from being lowered less than a voltage level increased through the first adjusting circuit.

6. The level shifter of claim 1, wherein the first adjusting unit includes:

a first switching element which is arranged in the first current path and the first power voltage is applied to a control terminal thereof; and a second switching element which is arranged in the second current path and the first power voltage is applied to a control terminal thereof.

7. The level shifter of claim 6, wherein the second adjusting unit includes a third switching element which is coupled to the second switching element and a delayed input signal is input to a control terminal thereof.

8. A level shifter comprising:

a first switching element configured to receive an input signal in response to a first power voltage;

a second switching element configured to receive an inverted input signal in response to the first power voltage;

a third switching element coupled between a power voltage terminal configured to receive a second power voltage and an output terminal;

a fourth switching element coupled between the power voltage terminal and the second switching element in parallel to the third switching element;

a fifth switching element which is coupled between the output terminal and the first switching element and a first bias voltage is applied to a control terminal thereof;

a sixth switching element which is coupled between the power voltage terminal and the output terminal in parallel to the third switching element and an internally generated compensation voltage is input to a control terminal thereof, a seventh switching element which is coupled between the first switching element and the fifth switching element and the first power voltage is applied to a control terminal thereof; and an eighth switching element which is coupled between the second switching element and the fourth switching element and the first power voltage is applied to a control terminal thereof.

9. The level shifter of claim 8, further comprising a compensation voltage generation unit coupled to the power voltage terminal in parallel to the fourth switching element and configured to generate the compensation voltage.

10. The level shifter of claim 8, further comprising a ninth switching element which is coupled between the second switching element and the eighth switching element and a delayed input signal is input to a control terminal thereof.

11. The level shifter of claim 8, wherein the fifth switching element is configured to maintain a voltage level of an output voltage of the output terminal to be equal to or greater than a value, the value equal to a sum of the first bias voltage and a threshold voltage of the fifth switching element.

12. The level shifter of claim 8, wherein the sixth switching element is configured to prevent a voltage level of the output terminal from being lowered less than a voltage level increased through the fifth switching element.

* * * * *